United States Patent
BrightSky et al.

(10) Patent No.: US 11,257,866 B2
(45) Date of Patent: Feb. 22, 2022

(54) INTEGRATED REACTIVE MATERIAL ERASURE ELEMENT WITH PHASE CHANGE MEMORY

(71) Applicant: INTERNATIONAL BUSINESS MACHINES CORPORATION, Armonk, NY (US)

(72) Inventors: Matthew J. BrightSky, Armonk, NY (US); Cyril Cabral, Jr., Yorktown Heights, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 334 days.

(21) Appl. No.: 16/692,586

(22) Filed: Nov. 22, 2019

(65) Prior Publication Data

US 2021/0257410 A1    Aug. 19, 2021

Related U.S. Application Data

(62) Division of application No. 14/871,030, filed on Sep. 30, 2015, now Pat. No. 10,535,713.

(51) Int. Cl.
*H01L 21/20*    (2006.01)
*H01L 27/24*    (2006.01)
(Continued)

(52) U.S. Cl.
CPC ........ *H01L 27/2463* (2013.01); *G11C 13/003* (2013.01); *G11C 13/0004* (2013.01);
(Continued)

(58) Field of Classification Search
CPC . H01L 27/2463; H01L 45/06; H01L 45/1233; H01L 45/143; H01L 45/144;
(Continued)

(56) References Cited

U.S. PATENT DOCUMENTS 7,755,935 B2    7/2010    Lam et al.
8,105,859 B2    1/2012    Breitwisch et al.
(Continued)

OTHER PUBLICATIONS

Fischer, S.H. et al. "A Survey of Combustible Metals, Thermites, and Intermetallics for Pyrotechnic Applications," presented at the 32nd AIAA/ASME/SAE/ASEE Joint Propulsion Conference (1996), pp. 1-13.
(Continued)

*Primary Examiner* — Meiya Li
(74) *Attorney, Agent, or Firm* — Scully, Scott, Murphy & Presser, P.C.; L. Jeffrey Kelly, Esq.

(57) ABSTRACT

A reactive material erasure element comprising a reactive material is located between PCM cells and is in close proximity to the PCM cells. The reaction of the reactive material is trigger by a current applied by a bottom electrode which has a small contact area with the reactive material erasure element, thereby providing a high current density in the reactive material erasure element to ignite the reaction of the reactive material. Due to the close proximity of the PCM cells and the reactive material erasure element, the heat generated from the reaction of the reactive material can be effectively directed to the PCM cells to cause phase transformation of phase change material elements in the PCM cells, which in turn erases data stored in the PCM cells.

20 Claims, 12 Drawing Sheets

(51) Int. Cl.
*H01L 45/00* (2006.01)
*G11C 13/00* (2006.01)

(52) U.S. Cl.
CPC ...... *G11C 13/0059* (2013.01); *G11C 13/0069* (2013.01); *G11C 13/0097* (2013.01); *H01L 45/06* (2013.01); *H01L 45/1233* (2013.01); *H01L 45/1286* (2013.01); *H01L 45/143* (2013.01); *H01L 45/144* (2013.01); *H01L 45/16* (2013.01); *G11C 2013/008* (2013.01); *G11C 2213/50* (2013.01)

(58) Field of Classification Search
CPC ... H01L 45/126; H01L 45/1286; H01L 45/16; H01L 45/1608
See application file for complete search history.

(56) References Cited

U.S. PATENT DOCUMENTS

| | | | |
|---|---|---|---|
| 8,728,859 B2 | 5/2014 | Breitwisch et al. | |
| 8,735,865 B2 | 5/2014 | Minemura et al. | |
| 8,773,919 B2 | 7/2014 | Miura et al. | |
| 8,816,717 B2 | 8/2014 | Fritz et al. | |
| 8,861,728 B2 | 10/2014 | Chu et al. | |
| 8,925,098 B2 | 12/2014 | Hyde et al. | |
| 8,971,527 B2 | 3/2015 | BrightSky et al. | |
| 2011/0057162 A1 | 3/2011 | Breitwisch et al. | |
| 2012/0039117 A1 | 2/2012 | Webb | |
| 2012/0093318 A1 | 4/2012 | Obukhov et al. | |
| 2013/0223173 A1 | 8/2013 | Higashi et al. | |
| 2014/0103286 A1* | 4/2014 | Chu | H01L 27/2472 257/5 |
| 2014/0103485 A1* | 4/2014 | Fritz | H01L 23/5252 257/530 |
| 2014/0103957 A1* | 4/2014 | Fritz | H01L 23/576 326/8 |
| 2016/0359635 A1 | 12/2016 | Kreft | |
| 2017/0092694 A1 | 3/2017 | BrightSky et al. | |
| 2017/0117465 A1 | 4/2017 | Chang et al. | |

OTHER PUBLICATIONS

List of IBM Patents or Patent Applications Treated as Related dated Nov. 22, 2019, 2 pages.

\* cited by examiner

INTEGRATED REACTIVE MATERIAL ERASURE ELEMENT WITH PHASE CHANGE MEMORY

STATEMENT OF GOVERNMENT RIGHTS

This invention was made with Government support under Contract No.: N00014-12-C-0472 awarded by the Office of Navy Research. The Government has certain rights in this invention.

BACKGROUND

The present application relates to phase change memory cells, and more particularly to integration of reactive material erasure elements with phase change memory cells.

Phase change memory (PCM) is a non-volatile solid-state memory technology that utilizes phase change materials having different electrical properties in their crystalline and amorphous phases. Specifically, the amorphous phase has a higher resistance than the crystalline phase. PCM cells are often programmed using heat generated by an electrical current to control the state of phase change materials.

PCM cells retain data stored therein even when electrical power fails or is turned off, which makes PCM cells vulnerable to tampering/attacks. Reactive materials (RM) which can generate heat through a spontaneously exothermic reaction have been explored as erasure elements in an integrated circuit containing PCM cells. The heat generated from the reaction of the reactive material can be used to induce phase transformation of the phase change material if sufficient heat can be directed to the PCM cells when tampering occurs, thus erasing the data stored in the PCM cells. Employing the reactive material as erasure elements is attractive since after erasure, there is no way to reverse engineer the bits in the PCM cells, while the remaining portion of the integrated circuit remains intact. Therefore, there remains a need to develop a method for integrating PCM cells and RM erasure elements that allows effectively triggering the erasure of the PCM cells.

SUMMARY

The present application provides a method for integrating a reactive material (RM) erasure element with PCM cells. A reactive material erasure element comprising a reactive material is located between PCM cells and is in close proximity to the PCM cells. The reaction of the reactive material is trigger by a current applied by a bottom electrode which has a small contact area with the reactive material erasure element, thereby providing a high current density in the reactive material erasure element to ignite the reaction of the reactive material. Due to the close proximity of the PCM cells and the reactive material erasure element, the heat generated from the reaction of the reactive material can be effectively directed to the PCM cells to cause phase transformation of phase change material elements in the PCM cells, which in turn erases data stored in the PCM cells.

In one aspect of the present application, a semiconductor structure is provided. The semiconductor structure includes a phase change memory (PCM) cell including a first bottom electrode, a phase change material element and a top electrode and a reactive material (RM) erasure element located on one side of the PCM cell and contacting a top surface of a second bottom electrode.

In another aspect of the present application, a semiconductor structure is provided. The semiconductor structure includes an array of phase change memory (PCM) cells arranged in rows and columns. Each of the PCM cells includes a first bottom electrode, a phase change material element and a top electrode. The semiconductor structure further includes at least one reactive material (RM) erasure element. The at least one RM erasure elements is disposed between each pair of adjacent columns of the PCM cells and contacts a top surface of a second bottom electrode.

In yet another aspect of the present application, a method of forming a semiconductor structure is provided. The method includes forming a first bottom electrode and a second bottom electrode extending through an insulator layer. The first bottom electrode contacts a top surface of a first bottom contact structure and the second bottom electrode contacts a top surface of a second bottom contact structure. The first and second bottom contact structures are electrically coupled to an access circuitry. A stack of, from bottom to top, a phase change material element and a top electrode is then formed contacting a top surface of the first bottom electrode. Next, a dielectric layer is formed over the stack, the second bottom electrode and the insulator layer. After forming a trench extending through the dielectric layer to expose the second bottom electrode, a reactive material (RM) erasure element is formed in the trench. The RM erasure element has a top surface located below a top surface of the dielectric layer. Next, a trench fill portion is formed over the RM erasure element to completely fill the trench.

DETAILED DESCRIPTION

Figure 1:
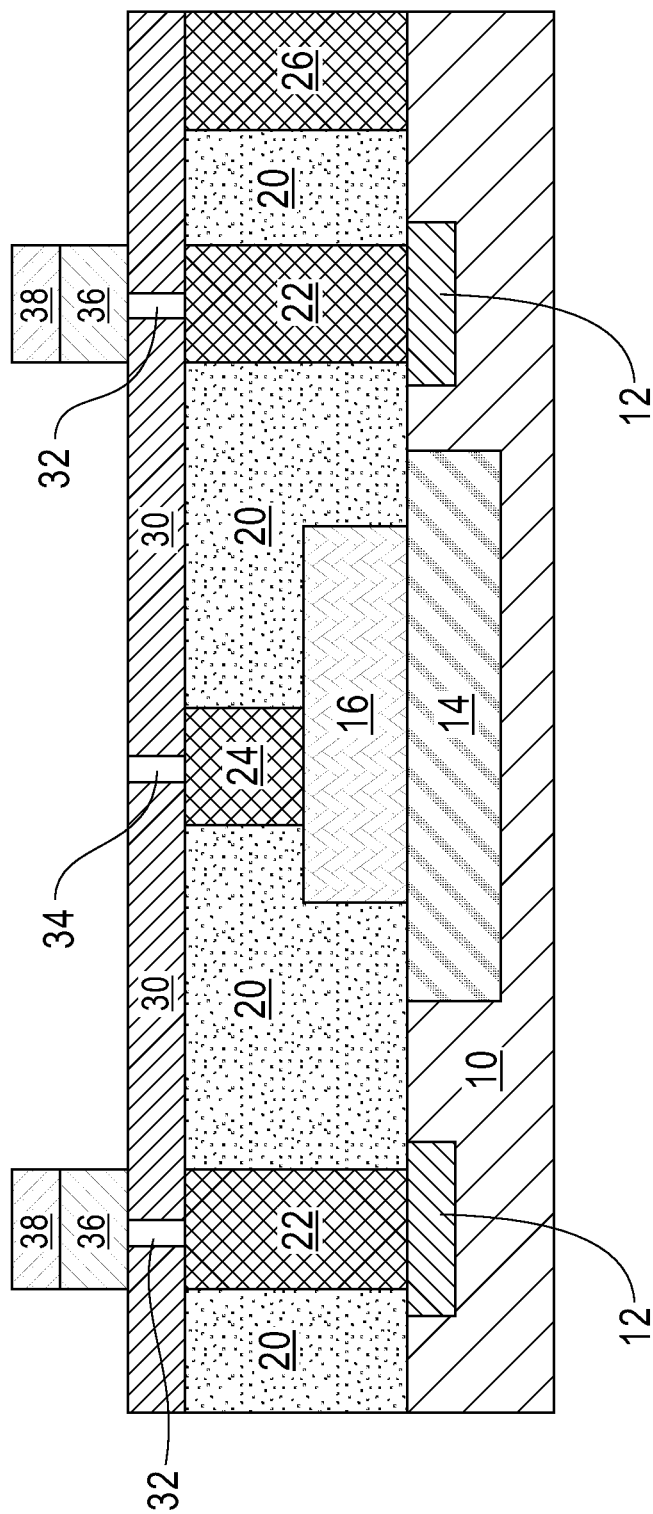
FIG. 1 is a cross-sectional view of an exemplary semiconductor structure including an array of phase change memory (PCM) cells formed over a semiconductor substrate including an access circuitry according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIG. 1 is a cross-sectional view of an exemplary semiconductor structure including an array of memory cells formed over a semiconductor substrate 10 including an access circuitry for the memory cells according to an embodiment of the present application. The access circuitry may include transistors such as complementary metal oxide semiconductor (CMOS) transistors or bipolar junction transistors (BJTs) or diodes. In one embodiment and as shown in FIG. 1, the access circuitry includes access transistors formed by typical CMOS processing techniques known in the art. Each of access transistors is defined by an active gate (not shown) present on an active device region of the semiconductor substrate 10 and a source region (not shown) and a drain region 12 present in portions of the semiconductor substrate 10 located on opposite sides of the active gate. A shallow trench isolation (STI) structure 14 is embedded in the semiconductor substrate 10 to isolate adjacent access transistors. A dummy gate 16 may be formed on the STI structure 14 as a local interconnect structure for access transistors. The active gate and dummy gate may each include a respective gate stack including a gate metal and a metal silicide located on top of the gate metal.

An interlevel dielectric (ILD) layer 20 is formed on the semiconductor substrate 10 overlying the access circuitry. The ILD layer 20 typically includes a low-k dielectric material such as, for example, silicon oxide, organosilicate glass or borophophosilicate glass. The ILD layer 20 can be formed by utilizing a deposition process such as, for example, chemical vapor deposition (CVD), physical vapor deposition (PVD) or spin-on coating.

Various bottom contact structures are then formed in the ILD layer 20 by forming contact openings (not shown) extending through the ILD layer 20 and filling the contact openings with a conductive material such as, for example, tungsten (W), titanium nitride (TiN) or copper (Cu). In some embodiments of the present application, before filling the contact openings with the conductive material, a contact liner (not shown) may be formed on exposed surfaces of each contact opening. In one embodiment, the contact liner includes TiN. In some embodiments of the present application and when the contact structures are formed of W, conductive caps of TiN (not shown) may also be formed on top of the bottom contact structures by recessing the conductive material deposited in the contact openings to provide voids and filling the voids with TiN. The bottom contact structures extend through the ILD layer 20 and include first bottom contact structures 22 contacting drain regions 12 of the access transistors, a second bottom contact structure 24 contacting the local interconnect structure (i.e., the dummy gate 16), and a third bottom contact structure 26 contacting the top surface of the semiconductor 10 or local interconnect structure (not shown). The third bottom contact structure 26 provides electrical communication to periphery circuitry (not shown).

Next, an insulator layer 30 containing an array of bottom electrodes is formed over the bottom contact structures 22, 24, 26 and the ILD layer 20. The insulator layer 30 may include a dielectric material such as silicon oxide, silicon nitride, silicon oxynitride, or a combination thereof. In one embodiment, the insulator layer 30 is composed of silicon nitride. The insulator layer 30 may be formed utilizing a deposition process such as, for example, CVD or PECVD. The insulator layer 30 that is formed may have a thickness ranging from 50 nm to 100 nm, although lesser and greater thicknesses can also be employed.

The bottom electrodes 32, 34 are separated from one another by the insulator layer 30 and include first bottom electrodes 32 contacting the first bottom contact structures 22, and a second bottom electrode 34 contacting the second bottom contact structure 24. Each of the bottom electrodes 32, 34 is composed of a conductive material such as, for example, TiN, W or tantalum nitride (TaN). The bottom electrodes 32, 34 can be any shape (e.g., ring shape or line type) as long as the bottom electrodes 32, 34 have a very small contact surface on the top. The very small contact surface tends to concentrate current density during operation of the circuit. The resulted high current density allows effectively triggering the reaction of a reactive material in a RM erasure element later formed on top of the second bottom electrode 34. The area of the top contact surface of each of the bottom electrodes 32, 34 can be from 10 nm$^2$ to 1000 nm$^2$, although lesser and greater areas can also be employed.

In one embodiment, each of the bottom electrodes 32, 34 has a sublithographic lateral dimension, that is, the lateral dimension of each bottom electrode 32, 34 is less than the lateral dimension of one feature size of the lithographic technology employed to fabricate the bottom electrodes 32, 34. For example, the lateral dimension of the bottom electrodes 32, 34 is typically less than 40 nm. In one embodiment, the lateral dimension of the bottom electrodes 32, 34 is approximately one-third the lithographic feature size.

In one embodiment, the bottom electrodes 32, 34 can be formed by a keyhole transfer method described in U.S. patent application Ser. No. 12/855,078, now U.S. Pat. No. 8,728,859, titled "Small Footprint Phase Change Memory Cell", which is owned by the assignee of the present application, and the entire disclosure of which is incorporated herein by reference.

Further shown in FIG. 1, a stack including, from bottom to top, a phase change material element 36 and a top electrode 38 is formed over each of the first bottom electrodes 32. A first bottom electrode 32, a phase change material elements 36 and a top electrode 38 together defines a PCM cell. After formation of the bottom electrodes 32, 34, a phase change material layer (not shown) is deposited as a blanket layer on top surfaces of the bottom electrode 32, 34 and the insulator layer 30. The phase change material layer may include a chalcogenide based material that can be programmable to an amorphous (high resistance) state or a crystalline (low resistance) state with application of heat. Exemplary chalcogenide based materials include, but are not limited, to $Ge_2Sb_2Te_5$ (GST), SbTe and $In_2Se_3$. The phase change material layer can be formed utilizing PVD-sputtering or magnetron-sputtering. Next, a top electrode layer (not shown) is deposited as a blanket layer on a top surface of the phase change material layer. The top electrode layer may include a conductive material the same as, or different from, the conductive material proving the bottom electrodes 32, 34. In one embodiment, the top electrode layer includes TiN. Subsequently, the material stack of the phase change material layer and the top electrode layer is patterned utilizing conventional photolithography and etching techniques to provide the stacks of the phase change material elements 36 and the top electrodes 38. The phase change material elements 36 and the top electrodes 38 have a lithographic lateral dimension which is greater than the sublithographic lateral dimension of the first bottom electrodes 32. The sidewalls of the first bottom electrodes 32 are thus offset from the sidewalls of the phase change material elements 36 and the top electrodes 38.

Figure 2:
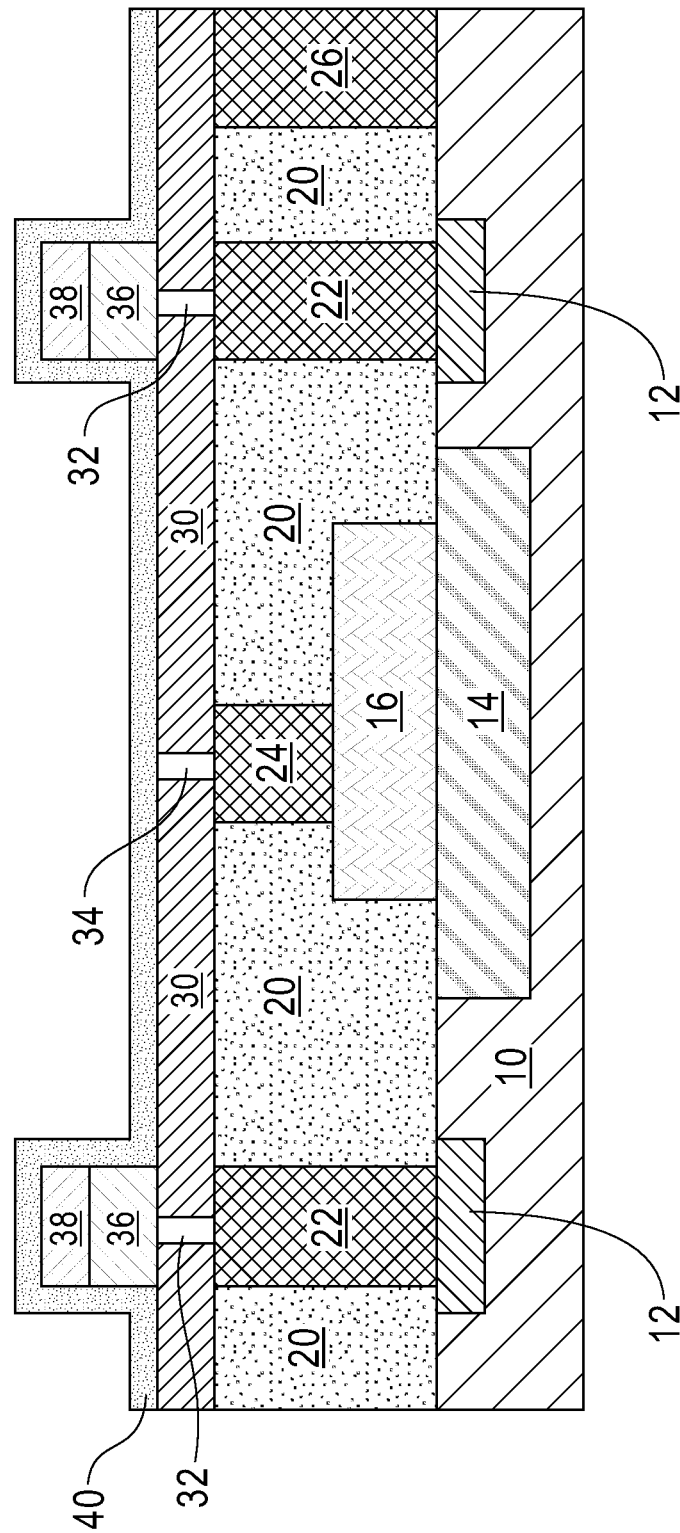
FIG. 2 is a cross-sectional view of the exemplary semiconductor structure of FIG. 1 after forming a first dielectric cap layer on exposed surfaces of the PCM cells and an insulator layer that surrounds an array of bottom electrodes.

Referring to FIG. 2, a first dielectric cap layer 40 is conformally deposited on the exposed surfaces of the insulator layer 30, the PCM cells (32, 36, 38) and the second bottom electrode 34, for example, by CVD or atomic layer deposition (ALD). The first dielectric cap layer 40 is typically composed of a dielectric nitride such as, for example, silicon nitride, silicon oxynitride, silicon boron nitride or silicon carbon oxynitride. The thickness of the first dielectric cap layer 40 can be from 5 nm to 30 nm, although lesser and greater thicknesses can be employed.

Figure 3:
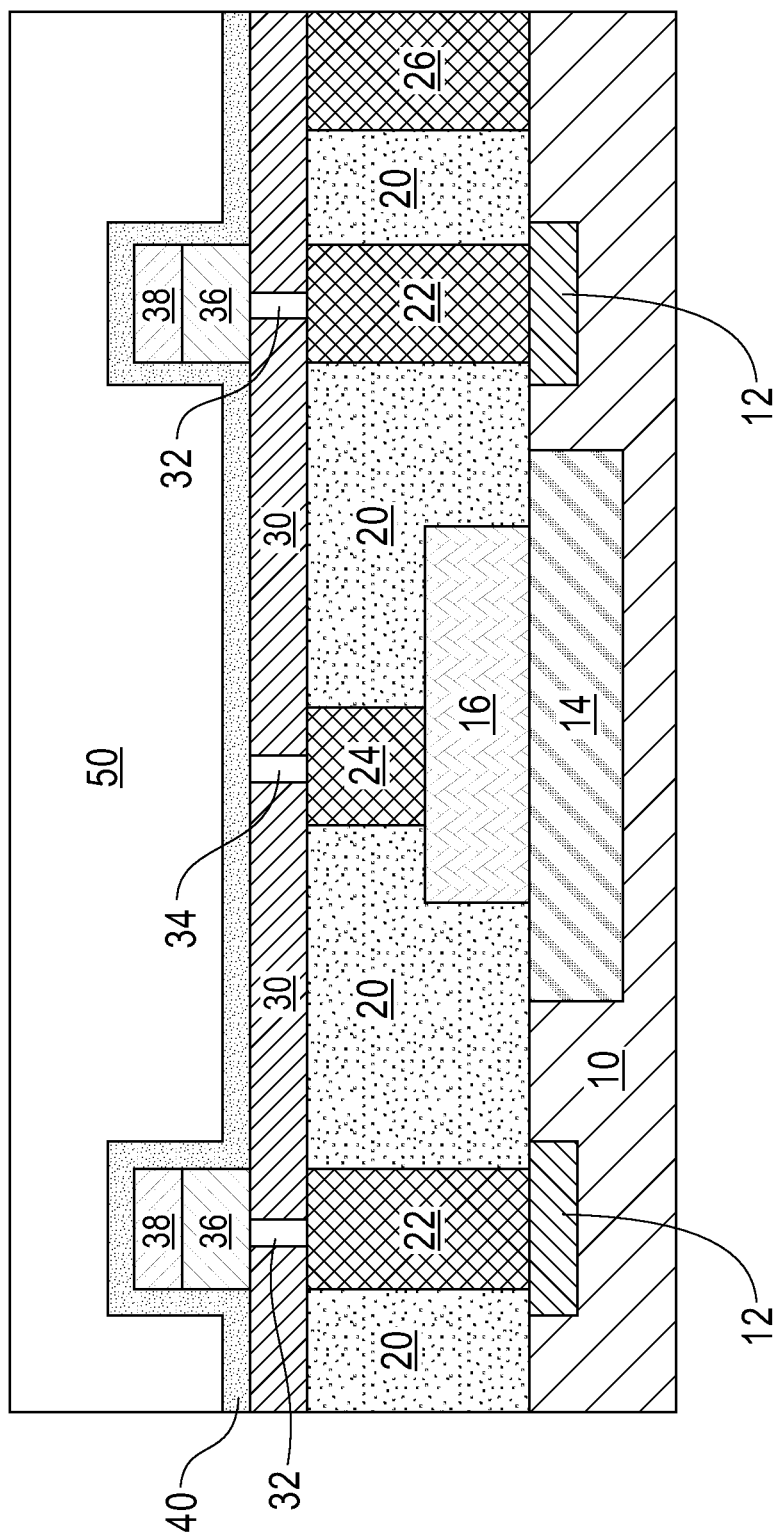
FIG. 3 is a cross-sectional view of the exemplary semiconductor structure of FIG. 2 after forming a first dielectric layer over the first dielectric cap layer.

Referring to FIG. 3, a first dielectric layer 50 is deposited over the first dielectric cap layer 40. The first dielectric layer 50 may include a dielectric material that is different from the dielectric material of the first dielectric cap layer 40. In one embodiment and when the first dielectric cap layer 40 is composed of silicon nitride, the first dielectric layer 50 can include a dielectric oxide such as silicon oxide. The first dielectric layer 50 can be formed by CVD, PVD or spin coating. The first dielectric layer 50 may be self-planarizing, or the top surface of the first dielectric layer 50 can be planarized, for example, by chemical mechanical planarization (CMP). The planarized top surface of the first dielectric layer 50 thus formed is located above the topmost surfaces of PCM cells (32, 36, 38).

Figure 4:
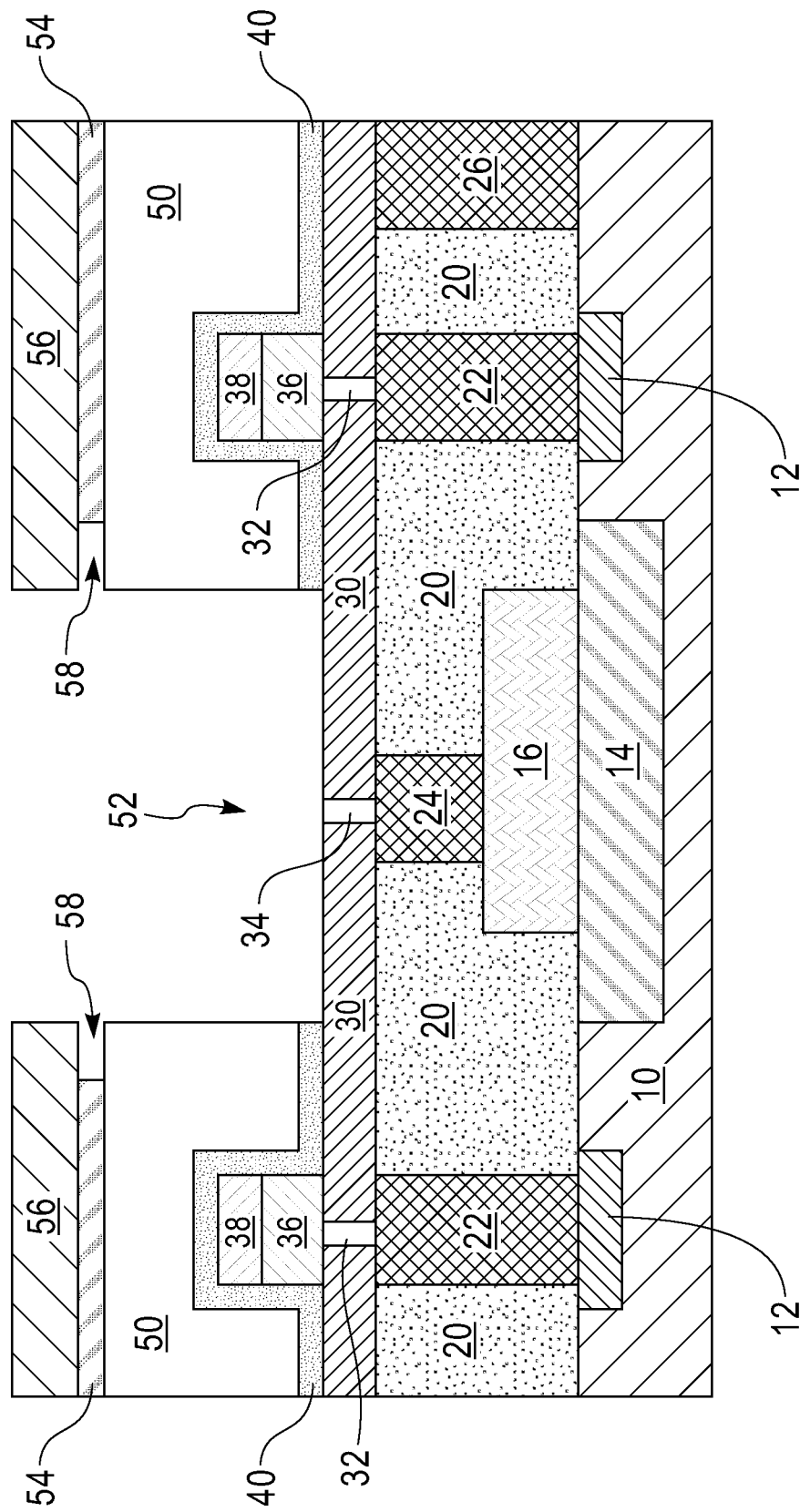
FIG. 4 is a cross-sectional view of the exemplary semiconductor structure of FIG. 3 after forming a trench extending through the first dielectric layer and the first dielectric cap layer.

Referring to FIG. 4, a trench 52 is formed extending through the first dielectric layer 50 and the first dielectric cap layer 40, thus exposing the second bottom electrode 34 at the bottom of the trench 52. The trench 52 is formed in close proximity to adjacent phase change material elements 36 in the PCM cells (32. 36, 38) such that the reactive material erasure element later formed in the trench 52 is situated sufficiently close to the adjacent PCM cells (32, 36, 38). This allows sufficient delivery of heat generated from the reaction of the reactive material to the PCM cells (32, 36, 38), which in turn causes the phase transformation of the phase change material. The state change of the phase change material leads to irreversible erasure of any data stored in the PCM cells (32, 36, 38). In one embodiment, the lateral distance between each sidewall of the trench 52 and a proximal sidewall of the phase change material element 36 can be from 0.5 µm to 5 µm.

The trench 52 can be formed by applying a mask layer over the first dielectric layer 50 and lithographically patterning the mask layer to form an opening therein. The opening overlies the second bottom electrode 34. In one embodiment and as shown in FIG. 4, the mask layer is a bilayer resist including a release layer 54 contacting a top surface of the first dielectric layer 50 and a photoresist layer 56 overlying the release layer 54. An undercut 58 of the release layer 54 beneath the photoresist layer 56 occurs during the lithography patterning process. The undercut 58 is desirable since it prevents a reactive material subsequently deposited from being formed on sidewalls of the photoresist layer 56 and connected to the reactive material deposited within the trench 52, and allows solvent to reach and dissolve the release layer 54 during removal of the mask layer (54, 56) and the reactive material deposited thereon.

The pattern of the opening in the mask layer (54, 56) is transferred through the first dielectric layer 50 and the first dielectric cap layer 40 to form the trench 52. In one embodiment, an anisotropic etch, such as RIE, may be performed to remove a portion of the first dielectric layer 50 that is exposed by the opening and a portion of the first dielectric cap layer 40 underlying the exposed portion of the first dielectric layer 50.

Figure 5:
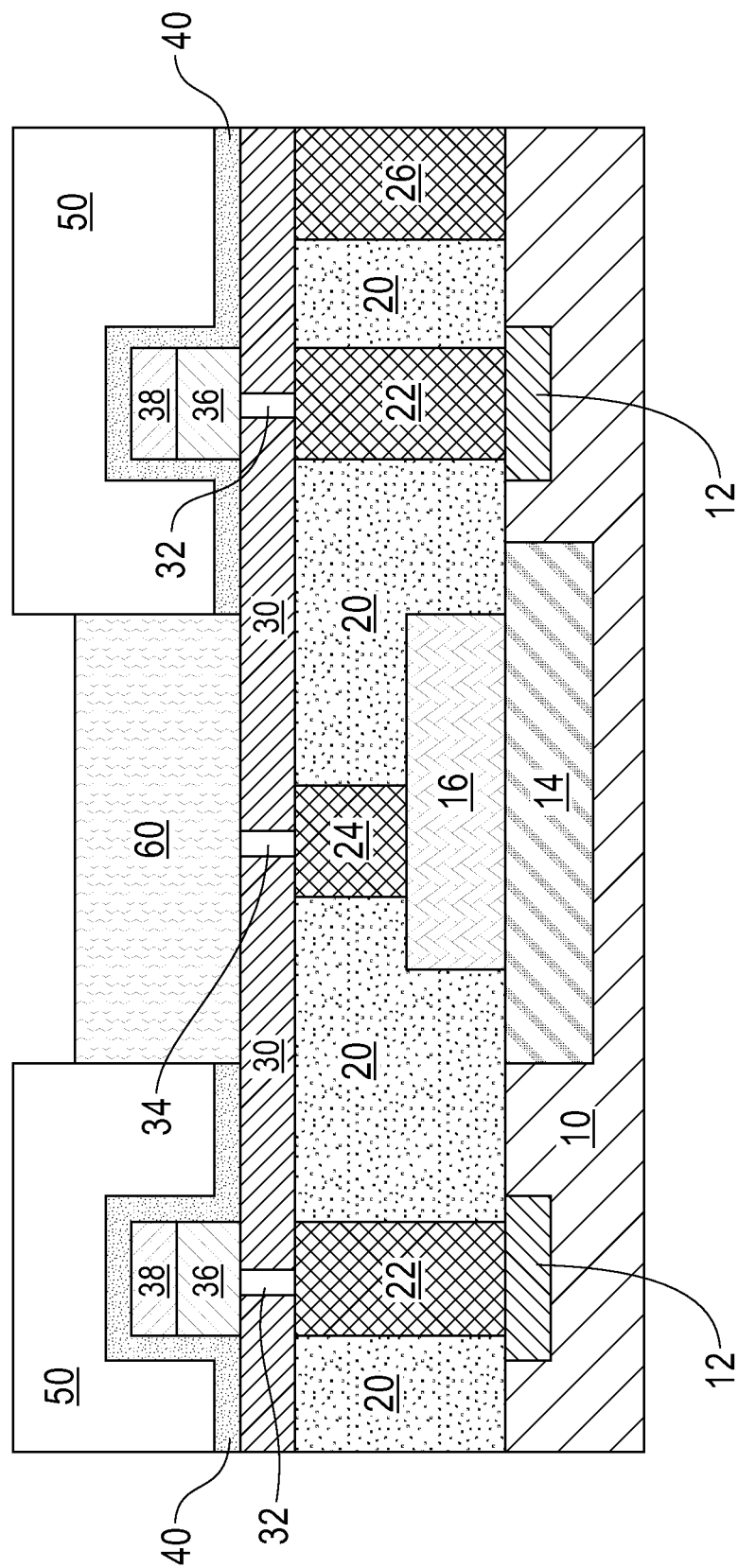
FIG. 5 is a cross-sectional view of the exemplary semiconductor structure of FIG. 4 after forming a reactive material (RM) erasure element within the trench.

Referring to FIG. 5, a reactive material (RM) erasure element 60 is formed within the trench 52. The RM erasure element 60 may include a reactive material that is inert during processing and survives normal chip operation and stress tests, but is sensitive enough to be ignited during tampering, thus providing sufficient heat to cause the phase transformation of the phase change material element 36 in the PCM cells (32, 36, 38). For example, the RM erasure element 60 may include a multilayer metal stack that causes an exothermic reaction when triggered by a current pulse generated by a voltage source. In one embodiment, the RM erasure element 60 includes Al/Pd, Ni/Al, Cu/Pd, Si/Cr or $SiO_2$/Al. Additionally, the preset application can utilize reactive material compositions described in Tables 1-3 in Fischer et al. "A Survey of Combustible Metals, Thermites, and Intermetallics for Pyrotechnic Applications," presented at the 32nd AIAA/ASME/SAE/ASEE Joint Propulsion Conference (1996), the disclosure of which is hereby incorporated by reference.

The RM erasure element 60 can be formed by depositing a reactive material in the trench 52 by any suitable deposition method such as, for example, CVD or PVD. The thickness of the RM erasure element 60 is set such that a top surface of the RM erasure element 60 is located below the top surface of the first dielectric layer 50. The RM erasure element 60 thus does not connect to the deposited reactive material on the sidewalls of the photoresist layer 56. In one embodiment, the thickness of the RM erasure element 60 can be from 1 nm to 15 µm, although lesser and greater thicknesses can also be employed. Upon dissolving the release layer 54 by a suitable solvent such as acetone, the deposited reactive material on top of the photoresist layer 56 can be lift off along with the photoresist layer 56, leaving only the RM erasure element 60 in the trench 52.

As described above, the processes in formation of the RM erasure element 60 in the present application are compatible with standard CMOS fabrication techniques, thereby allowing reducing fabrication cost during implementation and integration of such component with the PCM cells (32, 36, 38).

Figure 6:
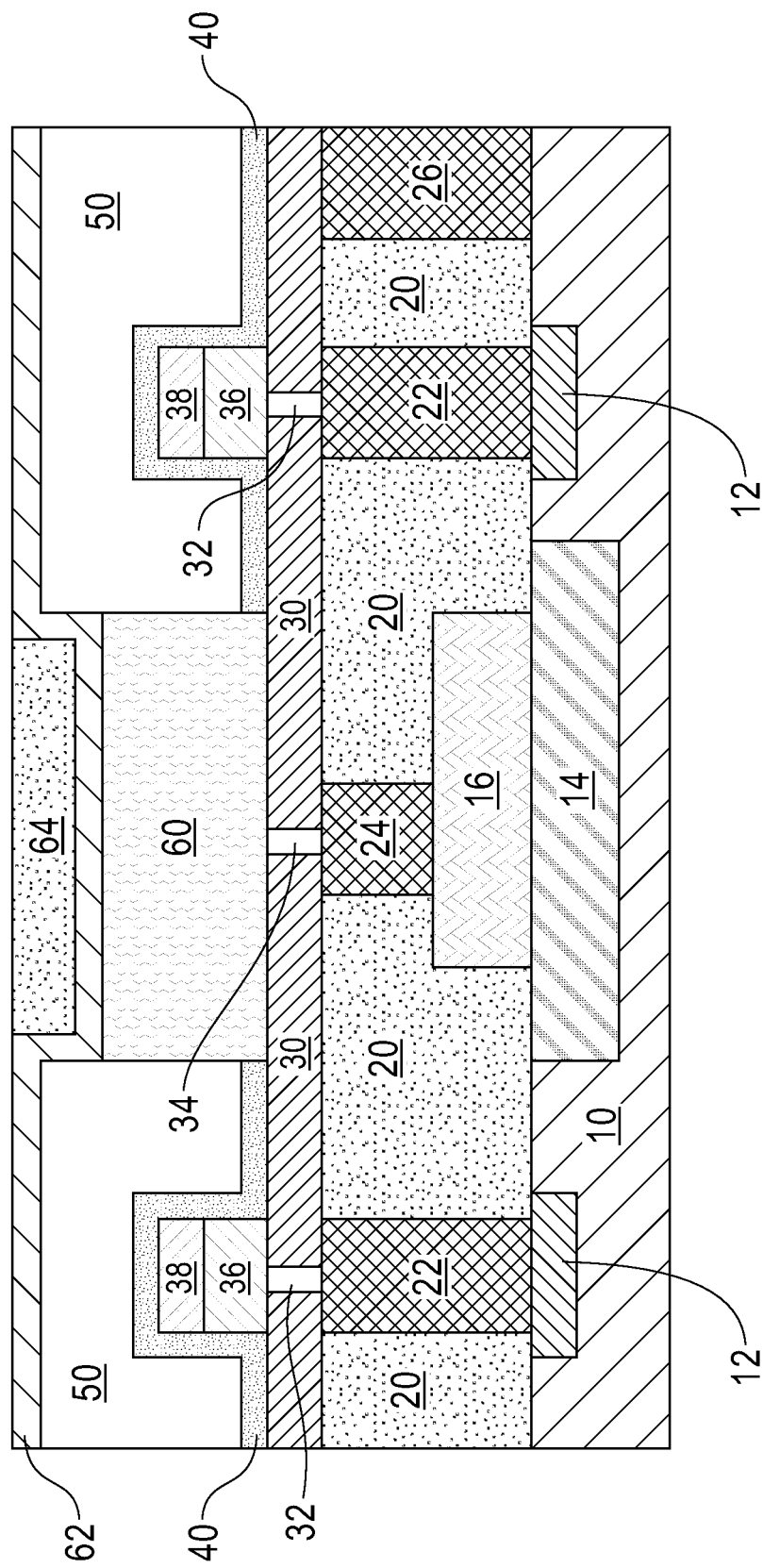
FIG. 6 is a cross-sectional view of the exemplary semiconductor structure of FIG. 5 after forming a second dielectric cap layer over the first dielectric layer and the RM erasure element and forming a trench fill portion to completely fill the trench.

Referring to FIG. 6, a second dielectric cap 62 is conformally deposited on the top surfaces of the first dielectric layer 50 and the RM erasure element 60 by CVD or ALD. The second dielectric cap layer 62 is composed of a dielectric nitride such as, for example, silicon nitride, silicon oxynitride, silicon boron nitride or silicon carbon oxynitride. The thickness of the second dielectric cap layer 62 can be from 5 nm to 30 nm, although lesser and greater thicknesses can be employed.

Next, a trench fill portion 64 is formed over the RM erasure element 60 to completely fill the trench 52. The trench fill portion 64 may include a dielectric material that is different from the dielectric material of the second dielectric cap layer 62. In one embodiment, when the second dielectric cap layer 62 includes silicon nitride, the trench fill portion 64 may include a dielectric oxide such as silicon oxide. The trench fill portion 64 can be formed by depositing a dielectric material over the second dielectric cap layer 62, for example, by CVD, and planarizing the deposited dielectric material employing the second dielectric cap layer 62 as a stopping layer. The planarization of the deposited dielectric material can be performed, for example, by CMP, a recess etch, or a combination thereof. In one embodiment, the top surface of the trench fill portion 64 is coplanar with the topmost surface of the second dielectric cap layer 62.

Figure 7:
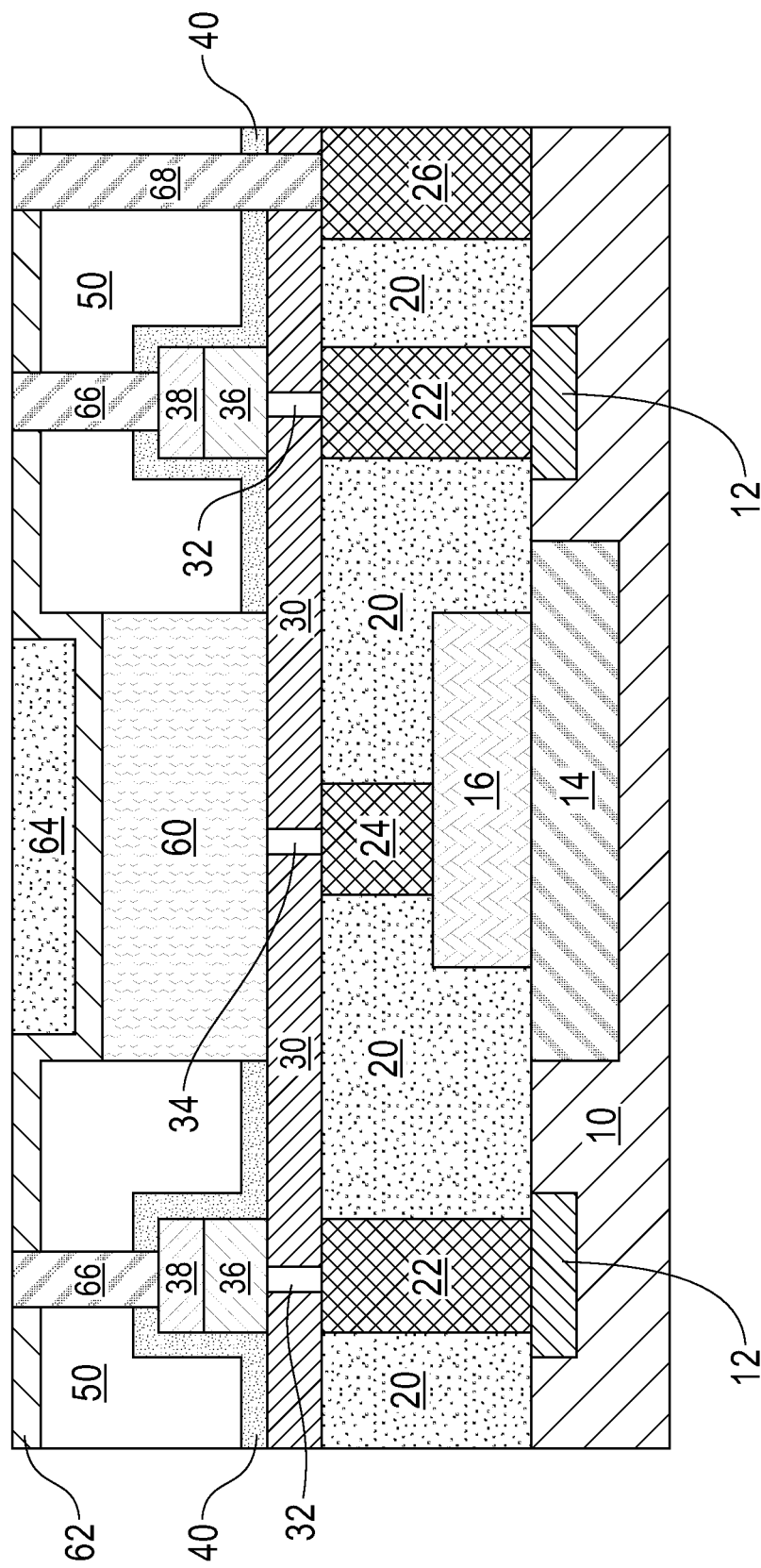
FIG. 7 is a cross-sectional view of the exemplary semiconductor structure of FIG. 6 after forming contact via structures in the second dielectric cap layer, the first dielectric layer and the first dielectric cap layer.

Referring to FIG. 7, various contact via structures are formed to provide electrical connection to the PCM cells (32, 36, 38) and the periphery circuitry. The contact via structures includes first contact via structures 66 that extend through the second dielectric cap layer 62, the first dielectric layer 50 and the first dielectric cap 40 and contact the top electrodes 38 of the PCM cells (32, 36, 38) and a second contact via structure 68 that extends through the second dielectric cap layer 62, the first dielectric layer 50, the first dielectric cap 40 and the insulator layer 30 and contacts the third bottom contact structure 26. The contact via structures 66, 68 can be formed by performing processing steps of FIG. 1 employed for formation of the bottom contact structures 22, 24, 26.

Figure 8:
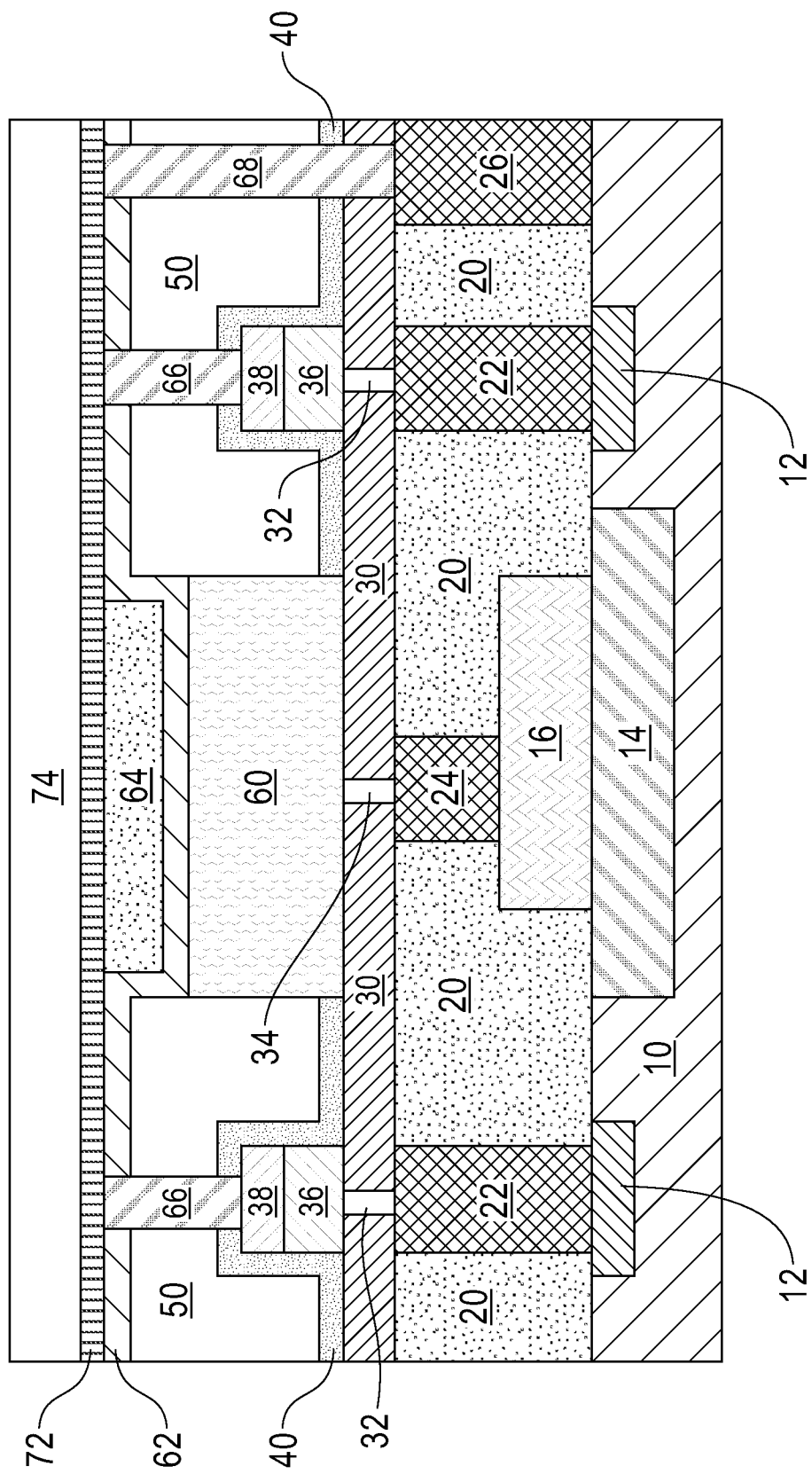
FIG. 8 is a cross-sectional view of the exemplary semiconductor structure of FIG. 7 after forming a third dielectric cap layer over the second dielectric cap layer, the contact via structures and the trench fill portion and forming a second dielectric layer over the third dielectric cap layer.

Referring to FIG. 8, a third dielectric cap layer 72 is conformally deposited on the top surfaces of second dielectric cap layer 62, the trench fill portion 64 and the contact via structures 66, 68, for example, by CVD or ALD. The third dielectric cap layer 72 is typically composed of a dielectric nitride such as, for example, silicon nitride, silicon oxynitride, silicon boron nitride or silicon carbon oxynitride. The thickness of the third dielectric cap layer 72 can be from 5 nm to 30 nm, although lesser and greater thicknesses can be employed.

Next, a second dielectric layer 74 is deposited over the third dielectric cap layer 72. The second dielectric layer 74 may include a dielectric material that is different from the dielectric material of the third dielectric cap layer 72. In one embodiment and when the third dielectric cap layer 72 is composed of silicon nitride, the second dielectric layer 74 can include a dielectric oxide such as silicon oxide. The second dielectric layer 74 can be formed by CVD, PVD or spin coating. The second dielectric layer 74 may be self-planarizing, or the top surface of the second dielectric layer 74 can be planarized, for example, by CMP.

Figure 9:
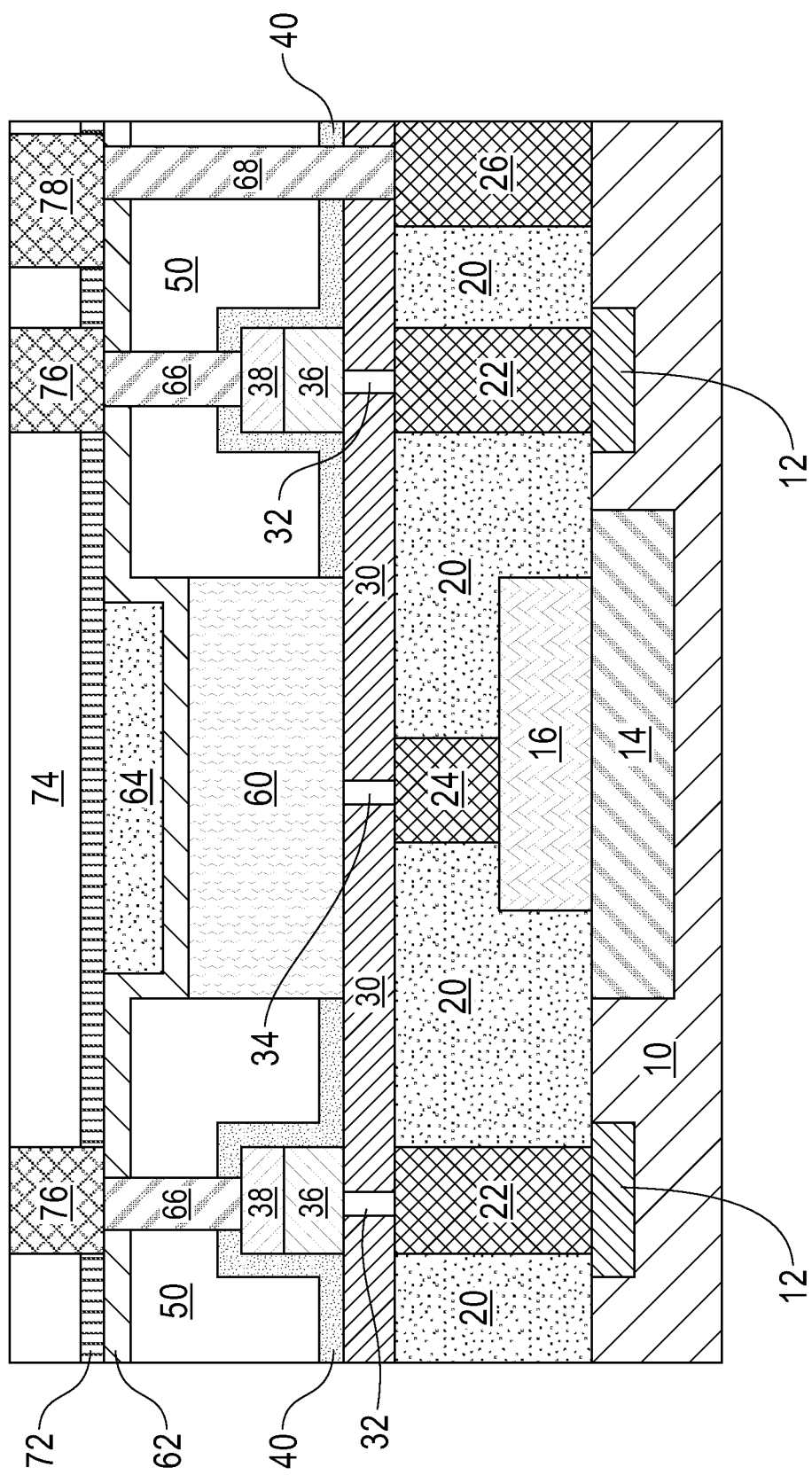
FIG. 9 is a cross-sectional view of the exemplary semiconductor structure of FIG. 8 after forming interconnect structures in the second dielectric layer and the third dielectric cap layer.

Referring to FIG. 9, interconnect structures are formed extending through the second dielectric layer 74 and the third dielectric cap layer 72 to provide electrical connection to the contact via structures 66, 68. The interconnect structures include first interconnect structures 76 contacting the first contact via structures 66 and a second interconnect structure 78 contacting the second contact via structure 68. The interconnect structures 76, 78 can be formed by performing processing steps of FIG. 1 employed for formation of the bottom contact structures 22, 24, 26.

Figure 10:
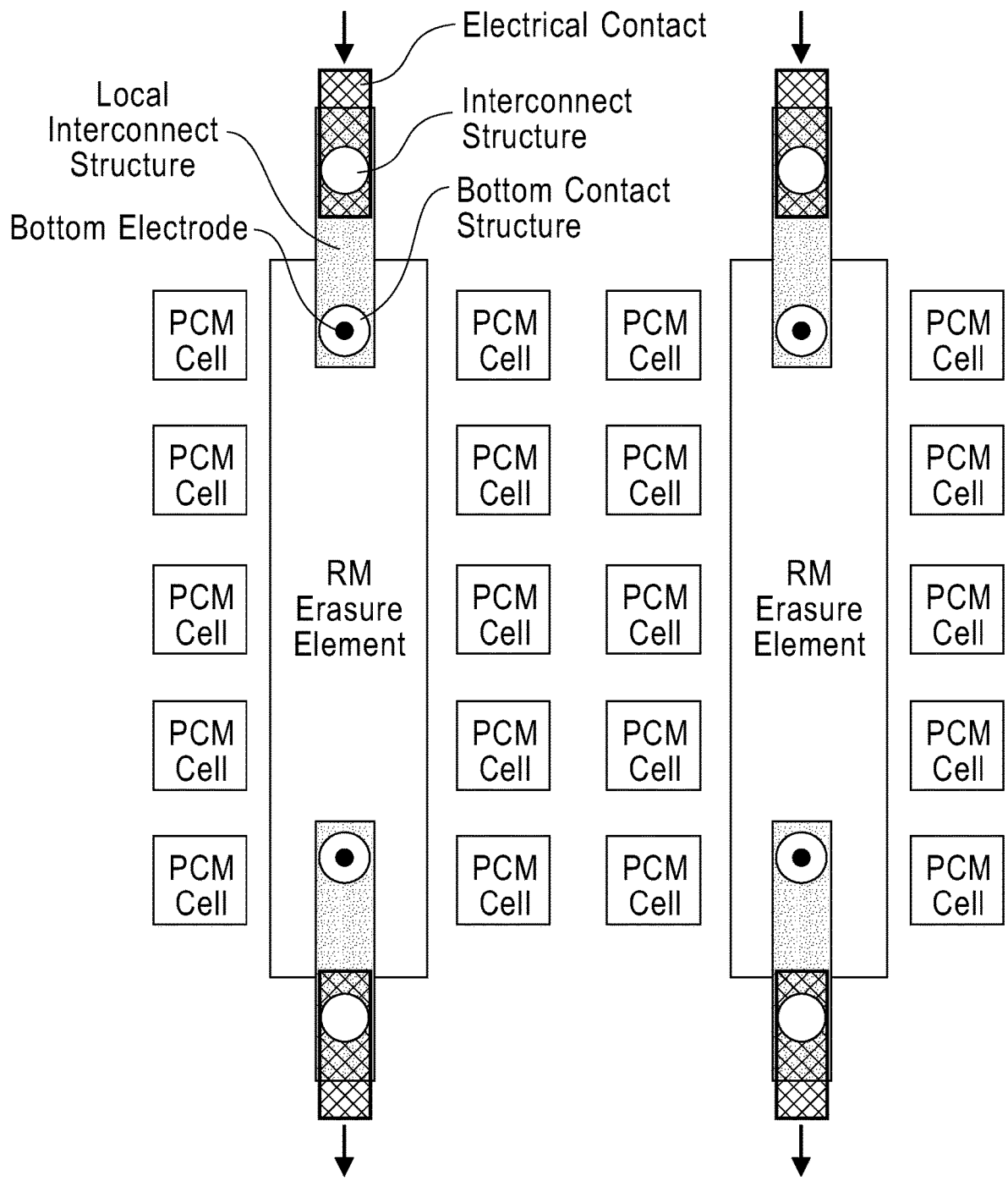
FIG. 10 is a simplified top view of FIG. 9 illustrating a first wiring scheme of the RM erasure element according to a first embodiment of the present application.

FIG. 10 is a simplified top view of FIG. 9 illustrating a first wiring scheme of RM erasure elements according to a first embodiment of the present application. In the first embodiment, a plurality of strip-shaped RM erasure elements is formed. Each of the RM erasure elements is arranged between a pair of adjacent columns of PCM cells in an PCM cell array and is electrically coupled to a voltage source through electrical contacts located at opposite ends of each of the RM erasure elements. The electrical contacts are in electrical communication with the second interconnect structure in a first metallization level. The second interconnect structure is electrically connected to the second bottom electrode through the second contact via structure and the third bottom contact structure. During erasure, current that flows into one end of each of the RM erasure elements and flows out the opposite end of each of the RM erasure elements causes a reaction of the reactive material which releases enough heat to crystallize and erase the state of each adjacent PCM cell.

Figure 11:
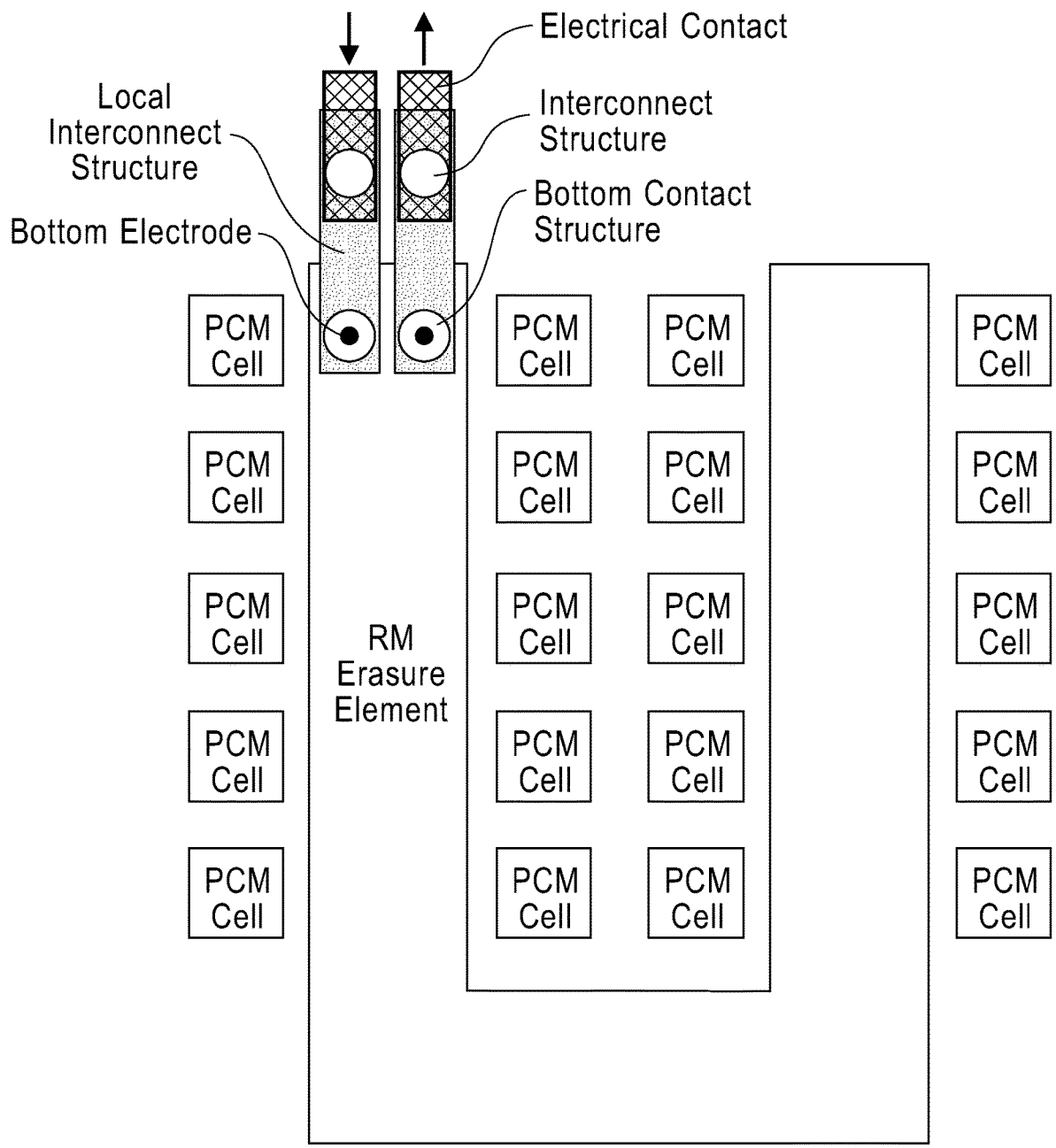
FIG. 11 is a simplified top view of FIG. 9 illustrating a second wiring scheme of the RM erasure element according to a second embodiment of the present application.

FIG. 11 is a simplified top view of FIG. 9 illustrating a second wiring scheme of a RM erasure element according to a second embodiment of the present application. In the second embodiment, the RM erasure element is a contiguous layer having a serpentine configuration such that parallel line portions of the RM erasure element are connected by a connecting segment. Each line portion of the RM erasure element is located between a pair of adjacent columns of PCM cells in an PCM cell array. The RM erasure element is electrically coupled to a voltage source through electrical contacts located at one end of the RM erasure element. The electrical contacts are in electrical communication with the second interconnect structure in a first metallization level. The second interconnect structure is electrically connected to the second bottom electrode through the second contact via structure and the third bottom contact structure. During erasure, current that flows in and out of the RM erasure element through electrical contact formed at the same end causes a reaction of the reactive material which releases enough heat to crystallize and erase the state of each PCM cell. In the second embodiment, because the RM erasure element is electrically coupled to the electrical contacts located at the same end of the RM erasure element, the contact via structures need only to be present at a single place. This can provide a great design flexibility.

Figure 12:
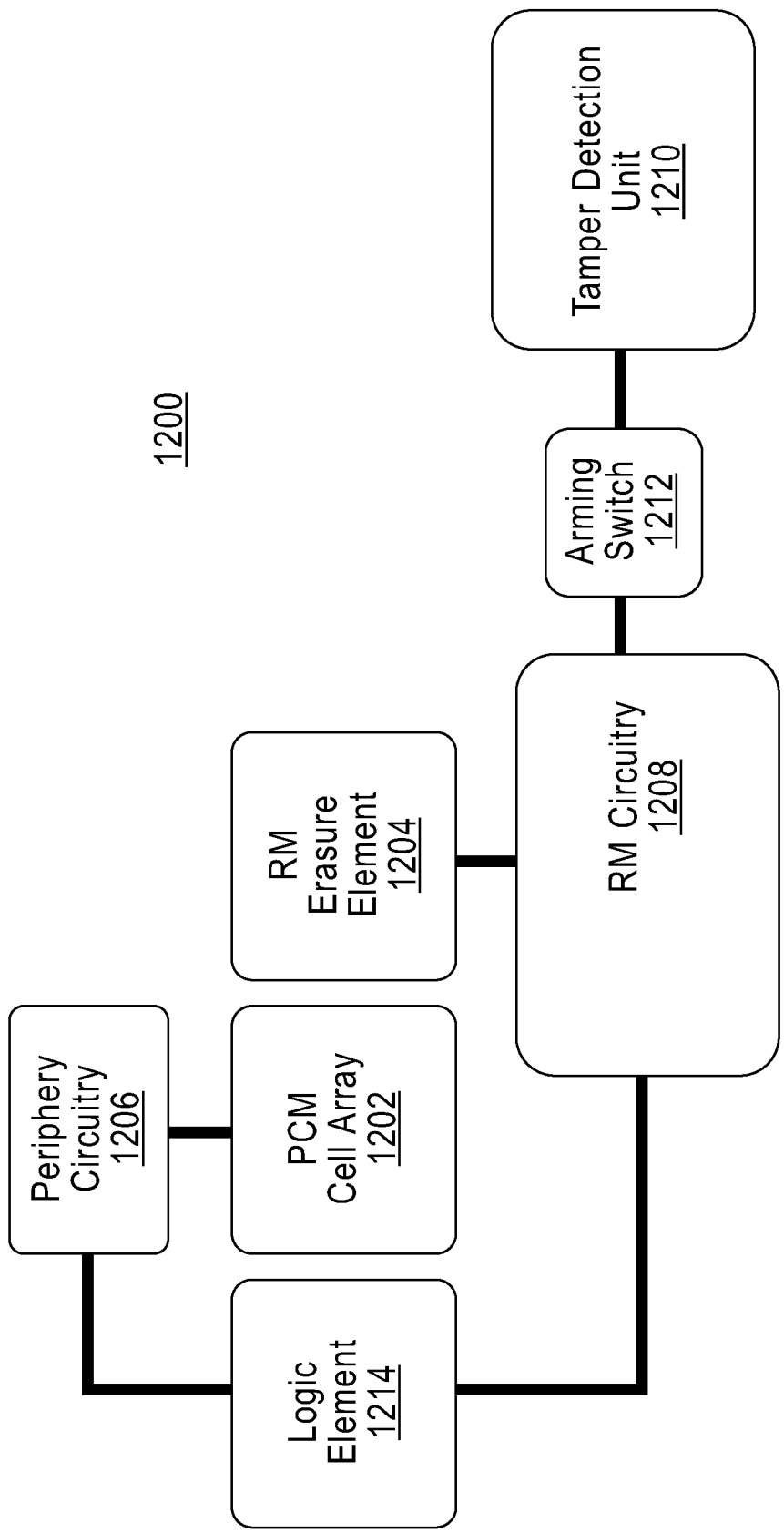
FIG. 12 is a block diagram of an integrated circuit including a PCM cell array and a RM erasure element according to an embodiment of the present application.

FIG. 12 is a block diagram of an integrated circuit according to an embodiment of the present application. The integrated circuit includes 1200 a PCM cell array 1202 and a RM erasure element 1204 implemented as described above. A periphery circuitry 1206 is electrically coupled to the PCM cell array 1202 and is configured to apply appropriate voltages to PCM cell array 1202 for write and read purposes. A RM circuitry 1208 is electrically coupled to the RM erasure element 1204 and is configured to control the amplitude of the current so that sufficient current can flow through the RM erasure element 1204 to trigger the reaction of the reactive material in the RM erasure element 1204. A tamper detection unit 1210 is electrically coupled to the RM circuitry 1208 to generate erase signal in response to the existence of one or several erase demand scenarios. The tamper detection unit 1210 may include photovoltaic cells, x-ray detectors or shock detectors. An arming switch 1212 may be situated in an electrical path between the tamper detection unit 1210 and the RM circuitry 1208 and is configured to prevent a flow of current until a deactivation or disarming signal is received. A logic element 1214 (e.g., a processor) is electrically coupled to the PCM periphery circuitry 1206 and the RM circuitry 1208 and is configured to perform an algorithm to determine conditions for triggering the reaction of the reactive material based on a multitude of inputs including inputs related to date and time, inputs related to environment such as, for example, temperature, humidity, pressure and precipitation, and inputs related transportation such as, for example, altitude, velocity, acceleration and direction.

While the application has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the application is intended to encompass all such alternatives, modifications and variations which fall within the scope and spirit of the application and the following claims.

What is claimed is:

1. A method for forming a semiconductor structure, comprising:
    forming a first bottom electrode and a second bottom electrode extending through an insulator layer, wherein the first bottom electrode contacts a top surface of a first bottom contact structure and the second bottom electrode contacts a top surface of a second bottom contact structure, the first contact structure and the second bottom contact structures electrically coupled to an access circuitry;
    forming a stack of, from bottom to top, a phase change material element and a top electrode contacting a top surface of the first bottom electrode;
    forming a dielectric layer over the stack, the second bottom electrode and the insulator layer;
    forming a trench extending through the dielectric layer, the trench exposing the second bottom electrode;
    forming a reactive material (RM) erasure element in the trench, wherein the RM erasure element has a top surface located below a top surface of the dielectric layer; and
    forming a trench fill portion over the RM erasure element to completely fill the trench.

2. The method of claim 1, wherein a lateral distance between a sidewall of the trench and a proximal sidewall of the stack is from 0.5 μm to 5 μm.

3. The method of claim 1, wherein an area of a top contact surface of each of the first bottom electrode and the second bottom electrode ranges from 10 nm$^2$ to 1000 nm$^2$.

4. The method of claim 1, wherein the forming the trench comprises:
    forming a mask layer over the dielectric layer, wherein the mask layer comprises a release layer and a photoresist layer overlying the release layer;
    forming an opening in the mask layer at a location adjacent to the stack by lithography patterning and etching, wherein an undercut is formed in the release layer during the lithography patterning and etching; and
    removing a portion of the dielectric layer exposed by the opening.

5. The method of claim 1, further comprising forming a first dielectric cap layer over the first bottom electrode and the second bottom electrode, wherein the trench extends through the first dielectric cap layer.

6. The method of claim 1, wherein the forming the trench fill portion comprises:
    forming a second dielectric cap layer over the first dielectric layer and the RM erasure element;
    depositing a dielectric material over the second dielectric cap layer; and
    removing the deposited dielectric material from a top surface of the second dielectric cap layer.

7. The method of claim 1, wherein the first bottom electrode and the second bottom electrode have a lateral dimension of less than 40 nm.

8. The method of claim 1, wherein the top electrode and the phase change material element both have a lateral dimension that is greater than a lateral dimension of the first bottom electrode.

9. The method of claim 1, wherein the second bottom contact structure is located on a surface of a dummy gate that is positioned on a surface of a shallow trench isolation structure.

10. The method of claim 1, wherein the RM erasure element comprises a reactive material that is inert during processing and survives normal chip operation and stress tests, but is sensitive to be ignited during tampering.

11. The method of claim 10, wherein the RM erasure element comprises a multilayer metal stack that causes an exothermic reaction when triggered by a current pulse generated by a voltage source.

12. The method of claim 11, wherein the multilayer metal stack comprises Al/Pd, Ni/Al, Cu/Pd, Si/Cr or SiO$_2$/Al.

13. The method of claim 4, wherein the forming of the RM erasure element comprises:
    depositing a reactive material in the trench and on the photoresist layer;
    dissolving the release layer utilizing a solvent; and
    removing, after the dissolving of the release layer, the reactive material located on the photoresist layer by utilizing a lift-off process.

14. The method of claim 1, wherein the RM erasure element has a lateral dimension that is greater than a lateral dimension of the second bottom electrode.

15. The method of claim 1, further comprising forming, prior to the forming of the trench fill portion, a dielectric cap layer on the top surface of each of the dielectric layer and the RM erasure element.

16. The method of claim 1, further comprising forming a first via contact structure contacting a surface of the top electrode.

17. The method of claim 16, further comprising forming an interconnect structure contact a surface of the first via contact structure.

18. The method of claim 1, wherein the phase change material is a chalcogenide based material.

19. The method of claim 1, further comprising a third bottom contact structure located laterally adjacent to the first bottom contact structure, wherein the third bottom contact structure contacts a surface of a semiconductor substrate.

20. The method of claim 19, further comprising forming a via contact structure contacting a surface of the third bottom contact structure.

* * * * *